(12) United States Patent
De Marco et al.

(10) Patent No.: US 9,294,119 B2
(45) Date of Patent: Mar. 22, 2016

(54) METHOD FOR IMPROVING THE ACCURACY OF AN EXPONENTIAL CURRENT DIGITAL-TO-ANALOG (IDAC) USING A BINARY-WEIGHTED MSB

(71) Applicant: Dialog Semiconductor GmbH, Kirchheim/Teck-Nabem (DE)

(72) Inventors: Louis De Marco, Swindon (GB); Pier Cavallini, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/166,035

(22) Filed: Jan. 28, 2014

(65) Prior Publication Data
US 2015/0214976 A1    Jul. 30, 2015

(30) Foreign Application Priority Data
Jan. 14, 2014    (EP) .................................. 14368014.8

(51) Int. Cl.
H03M 1/66    (2006.01)
H03M 1/68    (2006.01)

(52) U.S. Cl.
CPC ..................................... H03M 1/687 (2013.01)

(58) Field of Classification Search
CPC ........... H03M 1/06; H03M 1/10; H03M 1/66; H03M 1/74; H03M 1/84; H03M 1/664; H03M 1/1061; H03M 1/0692; H03M 1/68; H05B 33/08; H05B 33/086; H05B 39/00; G09G 3/32
USPC .................. 341/130–149; 315/291, 312, 313; 345/533–536, 8, 82, 84
See application file for complete search history.

(56) References Cited

U.S. PATENT DOCUMENTS 5,283,579 A * 2/1994 Tasdighi et al. ................ 341/145
5,389,928 A * 2/1995 Coppero et al. .............. 341/150
(Continued)

FOREIGN PATENT DOCUMENTS

EP    0 780 986    6/1997
EP    1 050 969    11/2000
EP    2 642 823    9/2013

OTHER PUBLICATIONS

European Search Report, 14368014.8-1802, Mailed: Jul. 23, 2014, Dialog Semiconductor GmbH.
(Continued)

Primary Examiner — Lam T Mai
(74) Attorney, Agent, or Firm — Saile Ackerman LLC; Stephen B. Ackerman

(57) ABSTRACT

A method for the design synthesis of an exponential current digital-to-analog (IDAC) using a binary-weighted MSB. The design synthesis involves defining an exponential LSB and exponential MSB current mirrors according to a defined methodology. A method to achieve an exponential current digital-to-analog converter (IDAC) having improved accuracy using a binary-weighted most significant bit (MSB) comprising (1) defining a differential non-linearity (DNL); (2) defining number of LSB bits needed for the targeted DNL with a binary weighted MSB; (3) calculating the number of bits to be used for the binary-weighted MSB to get the desired IDAC base; (4) deriving the minimum current for the Imax; (5) defining the LSB as an exponential current mirror according to the specified relationship for the ILSB; and (6) defining a binary-weighted MSB according to the specified relationship for IMSB.

12 Claims, 6 Drawing Sheets

(56) References Cited

U.S. PATENT DOCUMENTS

| | | | | |
|---|---|---|---|---|
| 5,398,030 | A * | 3/1995 | Sandell | 341/133 |
| 5,539,405 | A * | 7/1996 | Norsworthy | 341/153 |
| 5,606,320 | A * | 2/1997 | Kleks | 341/161 |
| 5,805,095 | A * | 9/1998 | Humphreys et al. | 341/144 |
| 6,154,162 | A * | 11/2000 | Watson et al. | 341/150 |
| 6,281,831 | B1 * | 8/2001 | Shou et al. | 341/159 |
| 7,038,402 | B1 * | 5/2006 | Adler | H05B 33/086 315/291 |
| 7,132,966 | B2 | 11/2006 | Adler et al. | |
| 7,834,796 | B2 * | 11/2010 | Xu et al. | 341/172 |
| 8,421,659 | B2 | 4/2013 | von Staudt | |
| 8,872,687 | B1 * | 10/2014 | Lin et al. | 341/144 |
| 8,969,774 | B2 * | 3/2015 | Johansson | 250/208.1 |
| 2006/0103562 | A1 * | 5/2006 | Adler | H03M 1/664 341/144 |
| 2006/0175990 | A1 * | 8/2006 | Adler | H05B 33/086 315/312 |
| 2009/0080267 | A1 | 3/2009 | Bedeschi et al. | |
| 2015/0214976 | A1 * | 7/2015 | De Marco | H03M 1/687 341/145 |
| 2015/0214977 | A1 * | 7/2015 | De Marco | H03M 1/687 315/210 |

OTHER PUBLICATIONS

Co-pending U.S. Appl. No. 14/166,097, filed Jan. 28, 2014, "An Apparatus for Improving the Accuracy of an Exponential Current Digital-to-Analog (IDAC) Using a Binary-Weighted MSB," by Louis De Marco et al., 29 pgs.

* cited by examiner

METHOD FOR IMPROVING THE ACCURACY OF AN EXPONENTIAL CURRENT DIGITAL-TO-ANALOG (IDAC) USING A BINARY-WEIGHTED MSB

RELATED PATENT APPLICATION

This application is related to Ser. No. 14/166,097, filed on Jan. 28, 2014, owned by a common assignee, and which is herein incorporated by reference in its entirety.

BACKGROUND

1. Field

The disclosure relates generally to a current digital-to-analog converter circuit, and, more particularly, to methods for an exponential current digital-to-analog converter (IDAC) having improved accuracy using a binary-weighted most significant bit (MSB) and a method thereof.

2. Description of the Related Art

Light emitting diode (LED) device brightness control is achieved by controlling the current that passes through the LED device. In order to dim LED device with less power dissipation than current control, a method of power control is used known as pulse width modulation (PWM). By varying the average current across the LED device, the device can be made to appear dimmer, or brighter. The brightness of current controlled light emitting sources is substantially proportional to the current flowing in them. Because of this characteristic, a digital-to-analog current converter (IDAC) is commonly used to control the brightness of visual displays.

Using a sole linear current digital-to-analog solution has the disadvantage of being perceived by human visual perception as a non-linear dimming process. Therefore a current source that is exponentially related to digital inputs, such as an exponential IDAC, is needed to maintain uniformity in changes to the level of the display brightness.

It is a common practice, the IDAC exponential characteristic is separated into a least significant bit (LSB) and most significant bit (MSB) parts as necessary to contain the circuit complexity and reduce the silicon area. The LSB generates an exponential current with a differential non-linearity for least significant bit, $DNL_{LSB}$, and so does the MSB with a differential non-linearity for the most significant bit. $DNL_{MSB}$.

As discussed in published U.S. Pat. No. 7,132,966 to Adler et al, a method to convert a floating point number into an analog current is discussed. The conversion is performed directly by using an exponential current digital-to-analog converter (e.g. exponential IDAC) and a cascaded linear current digital-to-analog converter (e.g. linear DAC).

As discussed in published U.S. Pat. No. 7,038,402 to Adler et al., a method to achieve linear and exponential control over current to drive color LEDs is shown. A method for convert floating point number into an analog current is discussed. The conversion is performed directly by using an exponential current digital-to-analog converter (e.g. exponential IDAC) and a cascaded linear current digital-to-analog converter (e.g. linear DAC) to drive color LEDS, and preferably red, green, blue (RGB) LEDs.

As illustrated in FIG. 1, an IDAC architecture is shown. In the implementation of FIG. 1, there is a LSB network that separates the LSB base current Io and the exponential part ILSB_exp. In the implementation of FIG. 1, there is a MSB network that separates the MSB base current Io and the exponential part IMSB_exp. FIG. 1 shows a power pad VDD 1, a ground rail VSS 2, a VIDAC_FB pad 3, a first PFET current mirror (20 and 21), a second PFET current mirror (30 and 31), a LSB network 40, and a MSB network 50, a buffer element 60, a transistor 70, and output transistor 80. The LSB network 40 contains a LSB diode 41, a transistor 42 for the base current Io, a variable transistor 43 for the exponent term ILSB_exp, and a LSB responsive switch 44. The MSB network 50 contains a MSB diode 51, a variable transistor 52 for the exponent term ILSB_exp, and a MSB responsive switch 54. Implementing equation for low differential non-linearity (DNL) values using one LSBdiode is feasible task to undertake, considering that at the first part of the characteristic is at relatively low currents and the exponential characteristic is easily approximated with a linear function plus correction terms. But, the difficulty is in the defining of the MSB. Implementing an equation becomes quite tricky if the differential non-linearity for the most significant bit $DNL_{MSB}$ is an irrational number, because that means synthesizing and implementing an MSB current mirror at high currents with an irrational gain. The only way to approximate an irrational gain is to implement several diodes with different gains within the MSB. Systematic error will occur in the overall IDAC DNL. Furthermore, matching between the different branches to contribute to the $DNL_{MSB}$ will be not achievable due to the different plurality of elements of different sizes (e.g. diode elements). These design challenges can easily turn a low DNL exponential IDAC into a high complexity, unmanageable design. In the attempt to simplify matters and to contain the expense of silicon area, a technique called "dithering" is being commonly used. This consists in targeting the design for higher differential non-linearity (DNL) for then getting lower DNL by switching the digital input between two consecutive codes, using an appropriate frequency and duty cycle. The dithering usually creates more issues than it was meant to solve, as it requires good dynamic performance by a structure that is inherently slow, being made of several big current mirrors. Furthermore, it doesn't resolve the problem of having an irrational MSB gain, and so a low DNL accuracy, if a proper architecture wasn't chosen in the first place.

As illustrated in FIG. 2, a high level diagram of a system to drive light emitting diode (LED) devices is shown. The block diagram shows a system 100, to drive a string of LED elements. The system contains a power output pad 101, a ground connection 102, an error amplifier 110, a pulse width modulation (PWM) comparator 120, a DC-DC converter 130, a series configured LED elements 140 to 141, a current source 150. The PWM used in the PWM comparator is not to be confused with the PWM used for dimming LEDs as noted in the prior discussion and description of FIG. 1. The IDAC that provides current control for the LEDs used in portable displays needs to be low voltage compliance to reduce the system power loss, so vital for the battery life. The lower the system is able to regulate the node VIDAC_FB the better the efficiency of the system. In the architecture shown in FIG. 1, the operating point of the MSB stage is set by the MSBdiode branch, so if VIDAC_FB goes below the drain voltage saturation, VDsat, of the MSBdiode device (referred to as IDAC voltage compliance) the current accuracy will be heavily affected. The IDAC voltage compliance (VDsat) is inversely proportional to the size of the MSB output devices. This means that to get good efficiency performance in driving the LEDs, area must be spent in designing the MSB. If the MSB is already large and complex to meet the DNL specification, it will be very difficult to meet the low voltage compliance requirement as well, which is inversely proportional to the MSB devices size. Also considering that different branches with different diodes, so different VDsat, are involved in generating the final output current. So it might not be possible to simply increase the MSB size to push the output voltage VOUT further down without squeezing some current branches. The voltage drop from the transistor NOUT also impacts the system efficiency.

In these prior art embodiments, the solution to design a low differential non-linearity (DNL) and low voltage compliant exponential digital-to-analog converter (IDAC) that minimizes architectural complexity and mismatch variations is not achieved.

SUMMARY

It is an object of the invention to address the design of a low differential non-linearity (DNL) exponential current digital-to-analog converter (IDAC) that minimizes architectural complexity and mismatch variations.

It is an object of the invention to obtain a simple low size MSB solution that allows to obtain a low voltage compliant IDAC to reduce the power loss.

It is an object of the invention to design a low voltage compliant exponential digital-to-analog converter (IDAC) utilizing a exponential LSB IDAC, and an exponential MSB IDAC.

It is an object of the invention to design a low voltage compliant exponential digital-to-analog converter (IDAC) utilizing a LSB and MSB current mirror.

A principal object of the present disclosure is to provide a method for improving the accuracy of an exponential IDAC using binary weighted MSB.

A principal object of the present disclosure is to provide a method to design a low differential non-linearity (DNL) exponential current digital-to-analog converter (IDAC) that minimizes architectural complexity and mismatch variations.

Another further object of the present disclosure is to provide a method to obtain a simple low size MSB solution that allows to obtain a low voltage compliant IDAC to reduce the power loss.

These and other objects are achieved by a method to achieve an exponential current digital-to-analog converter (IDAC) having improved accuracy using a binary-weighted most significant bit (MSB) comprising the steps of defining a differential non-linearity (DNL), defining number of LSB bits needed for the targeted DNL with a binary weighted MSB, calculating the IDAC base using the number of bits used for the MSB, deriving the minimum current for the Imax, defining the LSB as an exponential current mirror according to the specified relationship for the ILSB, and defining a binary weighted MSB according to the specified relationship for IMSB. As such, a method for improving the accuracy of an exponential current digital-to-analog converter (IDAC) using a binary weighted MSB is desired. Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

Figure 1:
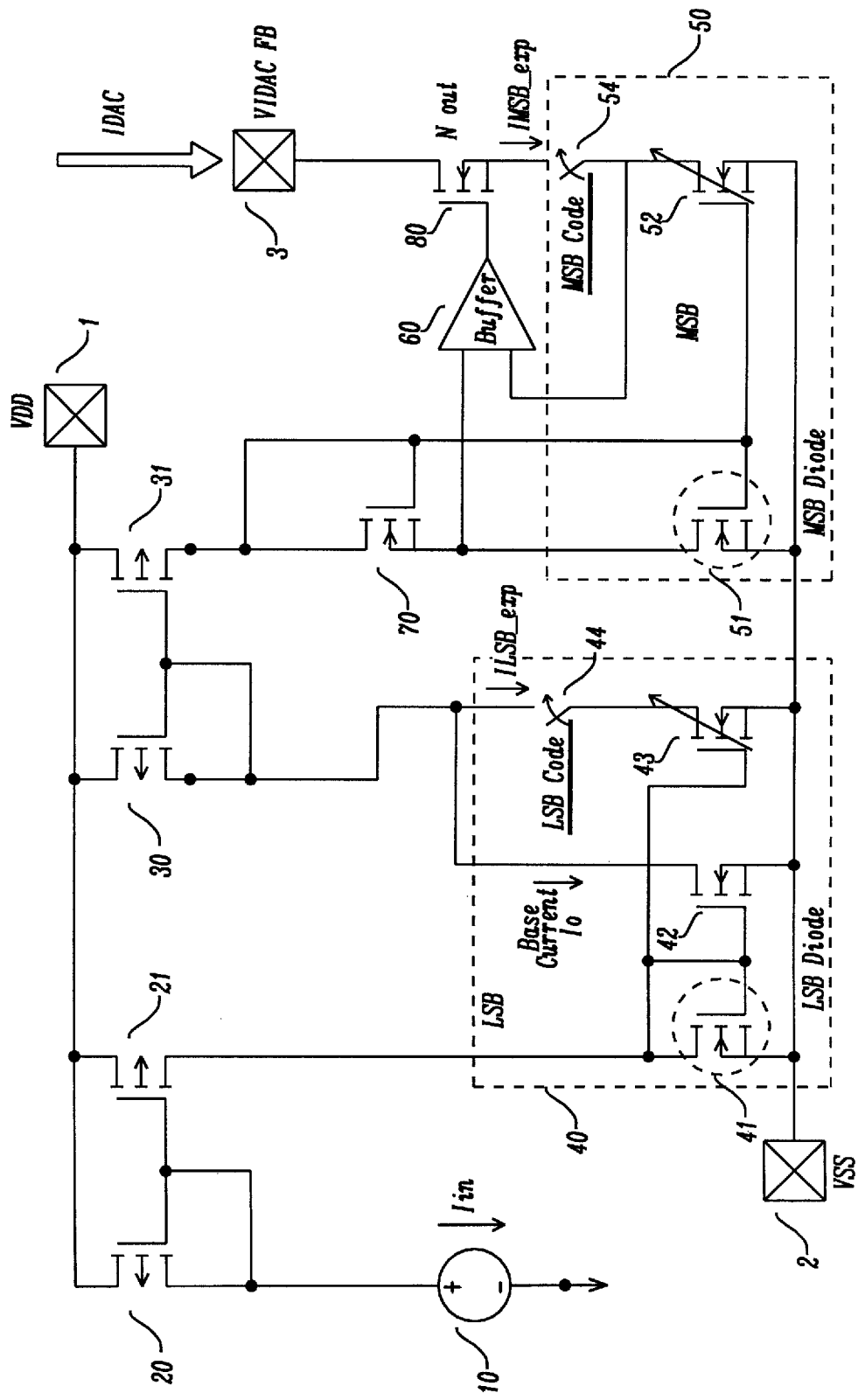
FIG. 1 is a circuit schematic diagram illustrating a prior art embodiment of a IDAC architecture.

FIG. 1 is a circuit schematic diagram illustrating a prior art embodiment of an IDAC architecture in accordance with a prior art embodiment. In the implementation of FIG. 1, there is a LSB network that separates the LSB base current To and the exponential part ILSB_exp. In the implementation of FIG. 1, there is a MSB network that separates the MSB base current Io and the exponential part IMSB_exp. FIG. 1 shows a power pad VDD 1, a ground rail VSS 2, a VIDAC_FB pad 3, a first PFET current mirror (20 and 21), a second PFET current mirror (30 and 31), a LSB network 40, and a MSB network 50, a buffer element 60, a transistor 70, and output transistor 80. The LSB network 40 contains a LSB diode 41, a transistor 42 for the base current Io, a variable transistor 43 for the exponent term ILSB_exp, and a LSB responsive switch 44. The MSB network 50 contains a MSB diode 51, a variable transistor 52 for the exponent term ILSB_exp, and a MSB responsive switch 54.

Figure 2:
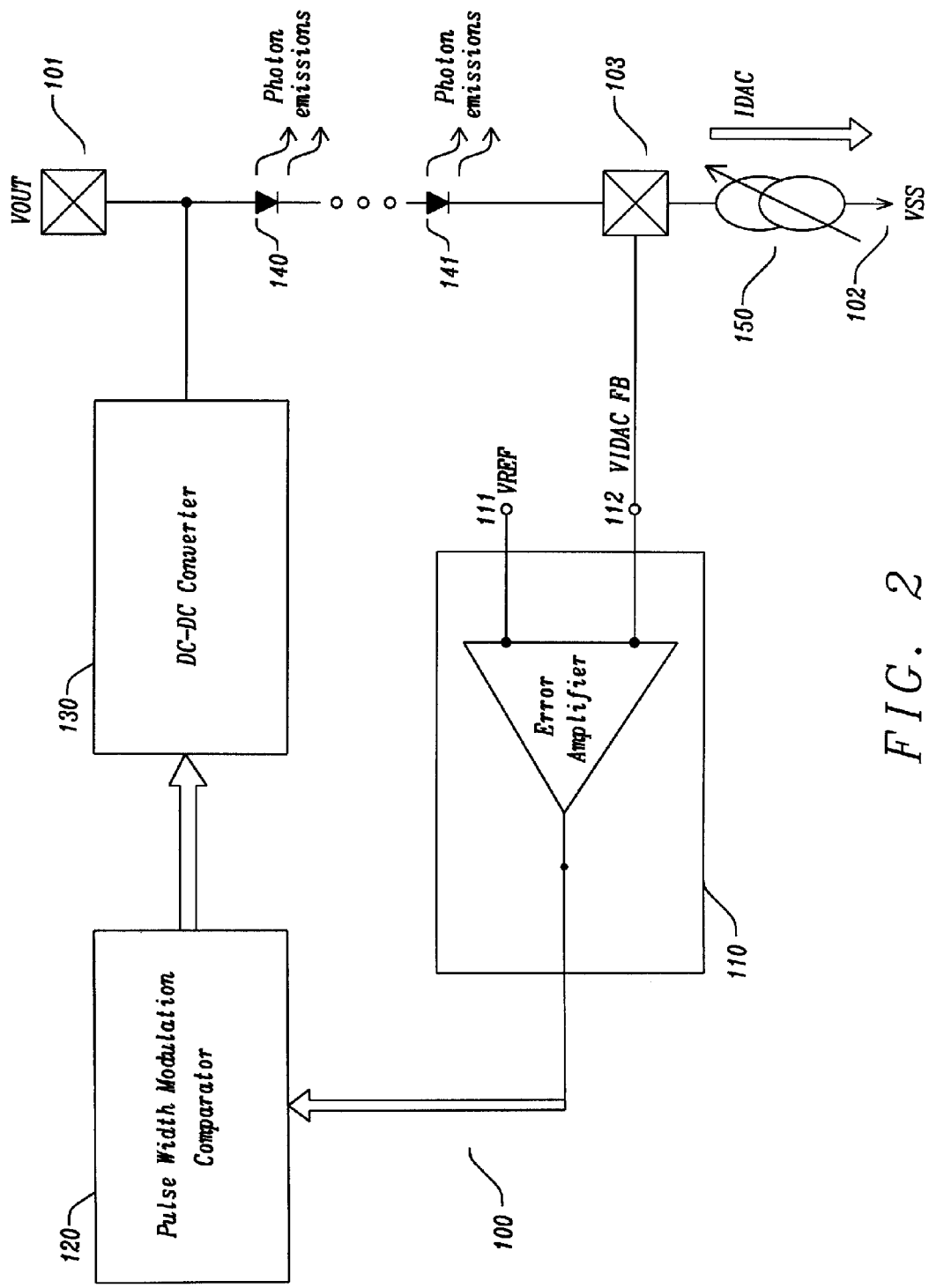
FIG. 2 is a circuit schematic diagram illustrating a prior art embodiment of a system for driving light emitting diode (LED) elements.

FIG. 2 is a circuit schematic diagram illustrating a prior art embodiment of a system for driving light emitting diode (LED) elements in accordance with prior art. As illustrated in FIG. 2, a high level diagram of a system to drive light emitting diode (LED) devices is shown. The block diagram shows a system 100, to drive a string of LED elements. The system contains a power output pad 101, a ground connection 102, a error amplifier 110, a pulse width modulation (PWM) comparator 120, a DC-DC converter 130, a series configured LED elements 140 to 141, a current source 150. The PWM used in the PWM comparator is not to be confused with the PWM used for dimming LEDs as noted in the prior discussion and description of FIG. 1.

Figure 3:
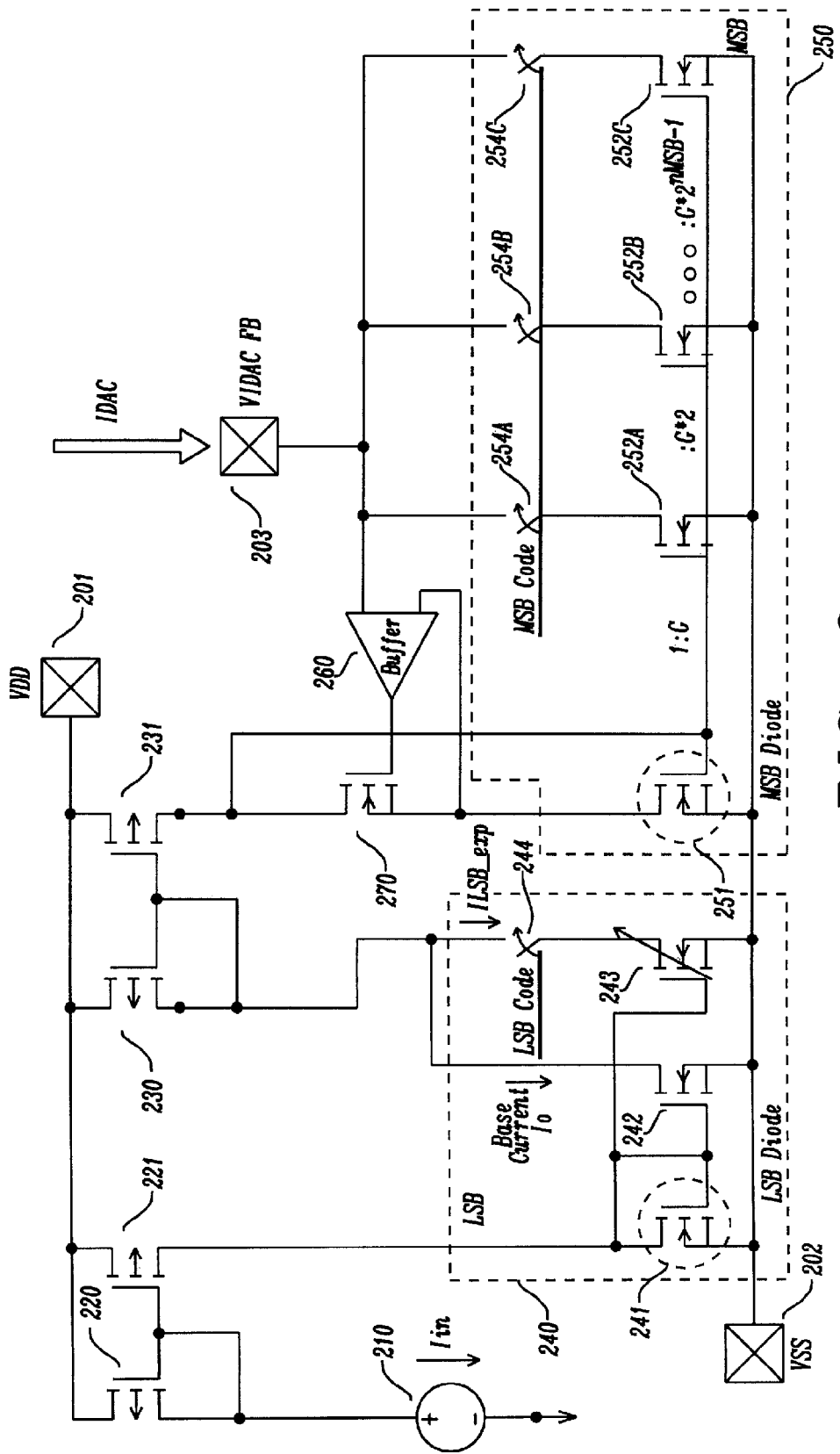
FIG. 3 is a circuit schematic diagram illustrating a exponential current digital-to-analog converter (IDAC) in accordance with one embodiment of the disclosure.

In the preferred embodiment, FIG. 3 is a circuit schematic diagram illustrating an exponential current digital-to-analog converter (IDAC) in accordance with one embodiment of the disclosure. In the implementation of FIG. 3, there is a LSB network that separates the LSB base current Io and the exponential part ILSB_exp. In the implementation of FIG. 3, there is a MSB network that separates the MSB base current Io and the exponential part IMSB_exp.

As illustrated in FIG. 3, shows a power pad VDD 201, a ground rail VSS 202, a VIDAC_FB pad 203, a current source Iin 210, a first PFET current mirror (220 and 221), a second PFET current mirror (230 and 231), a LSB network 240, a MSB network 250, a buffer element 260, and a transistor 270.

The LSB network 240 contains a LSB diode 241, a transistor 242 for the base current Io, a variable transistor 243 for the exponent term ILSB_exp, and a LSB responsive switch 244. The LSB network 240 has the gate of the transistor elements 241, 242, and 243 electrically connected to the drain of p-type current mirror transistor 221. The LSB diode 241 drain is connected to the drain of p-type current mirror transistor 221. The LSB transistor 242 drain is electrically connected to the p-type transistor drain 230 of the p-type current mirror formed from transistor 230 and 231. The drain of LSB transistor 243 is electrically connected to the LSB switch 244. The LSB switch is in series between the drain of LSB transistor 243 and the drain of p-type current mirror transistor 230. The LSB code initiates LSB switch 244.

The MSB network 250 contains a MSB diode 251, and a plurality of transistor elements and series switch elements. The plurality of transistor and series switch elements are illustrated as transistor 252A, and series switch 254A; transistor 252B, and series switch 254B; transistor 252C, and series switch 254C. The MSB code initiates the parallel switches for the MSB switch 254A, 254B, and 254C, as illustrated. The MSB diode 251 element is electrically connected to the transistor 270 and buffer input 260. The gates of the MSB diode 251, and transistors 252A, 252B, and 252C is electrically connected to the p-type current mirror element 231 from current mirror formed from transistors 230 and 231.

The architecture of the IDAC in FIG. 3, follows the formulation as follows:

$$IDAC = I_0(\text{base})^{\frac{code}{2^n-1}} = ILSB * MSB$$

where
  $I_0$=pedestal current,
  n=number of bits,
and, $$\text{base} = \text{contrast} = \frac{I_{max}}{I_0}$$

$$ILSB = \frac{I_0}{G}(\text{base})^{\frac{LSB_{code}}{2^n-1}}$$

$$MSB = G(\text{base})^{\frac{X*MSB_{code}}{2^n-1}}$$

$$n = nLSB + nMSB$$

where LSBcode=(0 . . . nLSB) and MSBcode=(0, . . . , nMSB).
The variable, G, is the current gain between LSB and MSB, and X is chosen appropriately.

$$\frac{(2^{nLSB}-1) + X*(2^{nMSB}-1)}{(2^n-1)} = 1 \rightarrow X = 2^{nLSB}$$

The differential non-linearity (DNL) is typically defined as the current step percentage, $$DNL\% = \frac{IDAC(n+1) - IDAC(n)}{IDAC(n)} * 100$$

In this embodiment, the DNL will be defined as the ratio of two consecutive steps, or as a percentage, as shown below, $$DNL = \frac{IDAC(n+1)}{IDAC(n)}$$

or $$DNL = 1 + \frac{DNL\ \%}{100}$$

As such, it is possible to represent the DNL as follows:

$$DNL = \frac{IDAC(n+1)}{IDAC(n)} = (\text{base})^{\frac{1}{2^n-1}} = DNL_{LSB}$$

The exponential IDAC network can be defined as a function of the LSB, the DNL, the nLSB, and MSBcode. The relationship for the implementation can be defined according to the following derivation $$MSB = G*[(DNL)^{2^{nLSB}}]^{MSB_{code}}$$

$$DNL_{MSB} = (DNL)^{2^{nLSB}}$$

The design synthesis of the exponential IDAC network is then defined by forming two exponential current mirror networks from the derivations, where one of the current source networks is for the least significant bit (LSB), and a second for the most significant bit (MSB).

The current through the LSB, the ILSB, can be defined as a function of the linear current Io, the gain parameter G, the DNL, and the LSBcode.

$$ILSB = \frac{I_0}{G} * (DNL)^{LSB_{code}}$$

The current through the MSB, the IMSB, can be defined as a function of the gain parameter G, the ILSB, the DNL of the MSB, and the MSBcode.

$$IMSB = G*ILSB*(DNL_{MSB})^{MSB_{code}}$$

In our preferred embodiment of the method of synthesis, by synthesizing a design of an exponential IDAC with a binary-weighted MSB, given the target DNL, we can define the number of bits needed for the LSB to achieve $DNL_{MSB}=2$.

$$2 = (DNL)^{2^{nLSB}}$$

In our preferred embodiment of the method of synthesis, the base required for the synthesis of a design of an exponential IDAC with a binary-weighted MSB, will determine the number of MSB bits that are required.

$$\text{base} = \frac{(2)^{2^{nMSB}}}{DNL}$$

Note that the formulas described are also applicable to the architecture of FIG. 1, as well as any architecture that employs an LSB and MSB current mirror to generate an exponential current.

Figure 4:
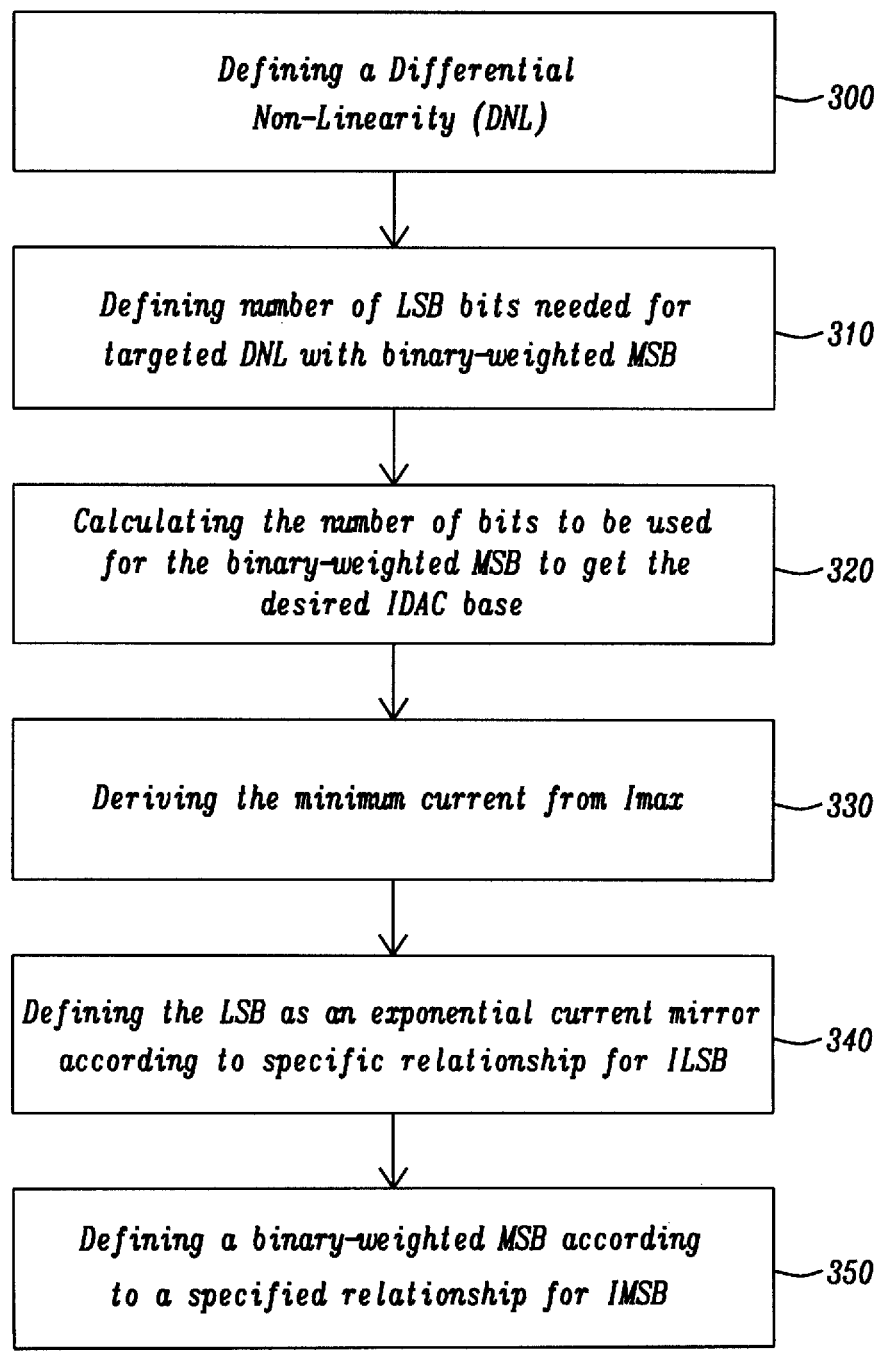
FIG. 4 is a high level diagram for the method for improving the accuracy of an exponential IDAC using a binary weighted MSB in accordance with one embodiment of the disclosure.

FIG. 4 is a high level diagram for the method of design synthesis for improving the accuracy of an exponential IDAC using a binary weighted MSB in accordance with one embodiment of the disclosure. A method to achieve an exponential current digital-to-analog converter (IDAC) having improved accuracy using a binary-weighted most significant bit (MSB) comprising:
  defining a differential non-linearity (DNL);

defining number of LSB bits needed for the targeted DNL with a binary weighted MSB;

calculating the number of bits to be used for the binary-weighted MSB to get the desired IDAC base;

deriving the minimum current for the Imax;

defining the LSB as an exponential current mirror according to the specified relationship for the ILSB; and defining a binary weighted MSB according to the specified relationship for IMSB.

As the first step 300, a differential non-linearity (DNL) is defined. The second step 310 defines the number of LSB bits needed for the targeted DNL with a binary weighted MSB. The third step 320 calculates the number of bits to be used for the binary-weighted MSB to get the desired IDAC base. The fourth step 330 derives the minimum current for the Imax. The fifth step 340 defines the LSB as an exponential current mirror according to the specified relationship for the ILSB. The sixth step 350 defines a binary weighted MSB according to the specified relationship for IMSB.

Figure 5:
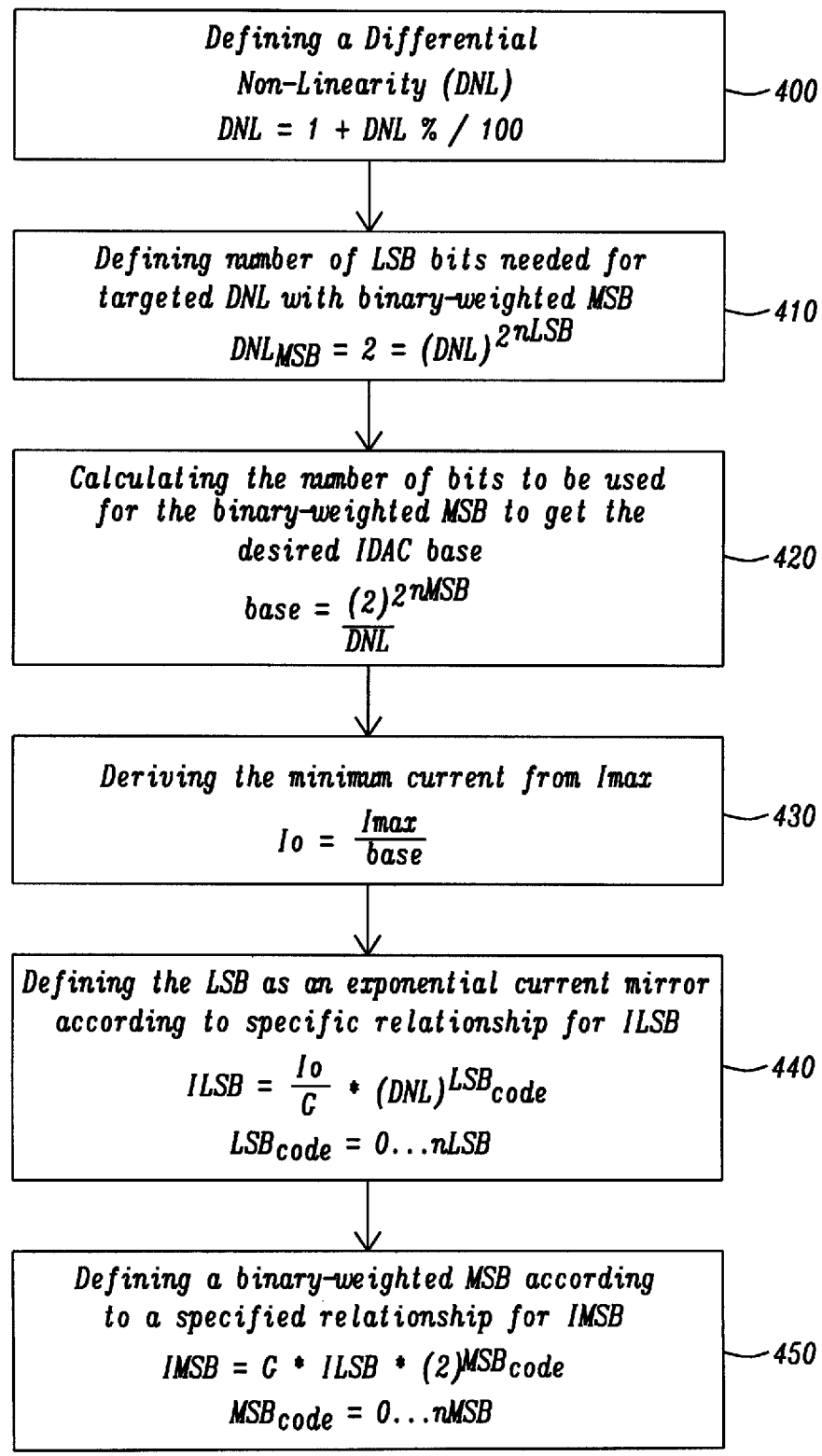
FIG. 5 is a diagram for the method for improving the accuracy of an exponential IDAC using a binary weighted MSB in accordance with one embodiment of the disclosure.

FIG. 5 is a diagram for the method for improving the accuracy of an exponential IDAC using a binary weighted MSB in accordance with one embodiment of the disclosure. A method to achieve an exponential current digital-to-analog converter (IDAC) having improved accuracy using a binary-weighted most significant bit (MSB) comprising:

Defining a differential non-linearity (DNL) according to the definition $$DNL = 1 + \frac{DNL\ \%}{100};$$

Defining number of LSB bits needed for the targeted DNL with a binary weighted MSB $$DNL_{MSB} = (DNL)^{2^{nLSB}};$$

Calculating the number of bits to be used for the binary weighted MSB to get the desired IDAC base $$base = \frac{(2)^{2^{nMSB}}}{DNL};$$

Deriving the minimum current for the Imax $$Io = Imax/base;$$

Defining the LSB as an exponential current mirror according to the specified relationship for the ILSB $$ILSB = \frac{I_0}{G} * (DNL)^{LSB_{code}}$$

For LSB code=0, . . . n LSB; and

Defining a binary weighted MSB according to the specified relationship for IMSB, $$IMSB = G * ILSB * (DNL_{MSB})^{MSB_{code}}$$

For MSB code=0, . . . n MSB

As the first step 400, a differential non-linearity (DNL) is defined. The second step 410 defines the number of LSB bits needed for the targeted DNL with a binary weighted MSB. The third step 420 calculates the number of bits to be used for the binary-weighted MSB to get the desired IDAC base. The fourth step 430 derives the minimum current for the Imax. The fifth step 440 defines the LSB as an exponential current mirror according to the specified relationship for the ILSB. And the last step 450 defines a binary weighted MSB according to the specified relationship for IMSB.

As an example of the methodology, considering that, according to definition, it is usually DNL about 1, the number of nMSB will depend on how much contrast is needed. Typically, an IDAC to drive a light emitting diode (LED) string, needs a maximum current in the order of 25 mA. To guarantee an appropriate range of dimming you might want to be able to go down to tens of uA as minimum current. This means that, based on equation, nMSB=3 is possible.

$$base = \frac{(2)^{2^3}}{DNL} \cong 256 \rightarrow Imin = \frac{25\ mA}{256} \cong 98\ uA$$

Following the procedure summarized in FIG. 4 and FIG. 5, it is possible to design an exponential IDAC with a 3-bits binary-weighted MSB, which will be easy to layout, more accurate and simple enough to allow spending area to meet the low voltage compliance specification. FIG. 3 is an example embodiment associated with the methodology defined in the disclosure.

Figure 6:
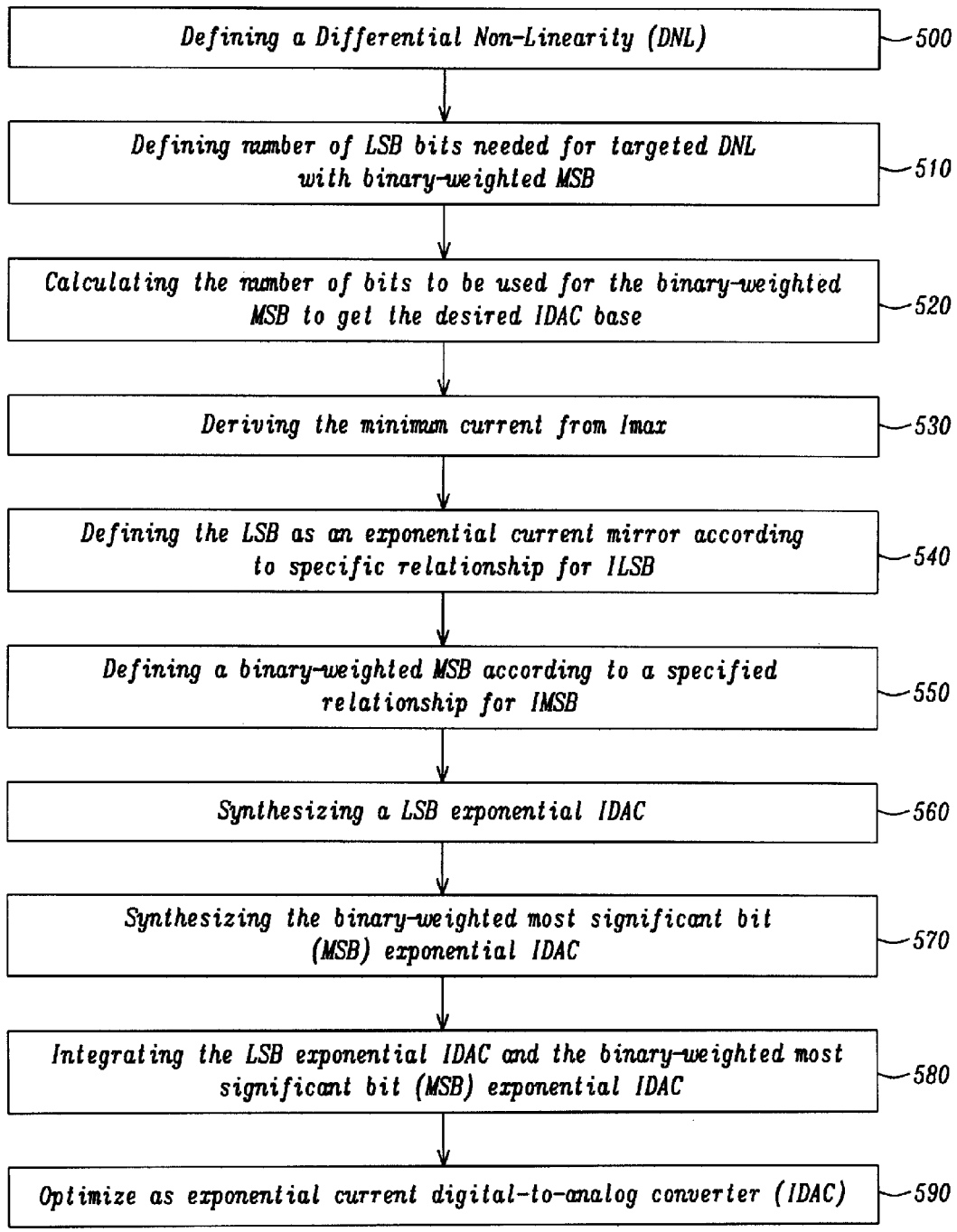
FIG. 6 illustrates shows a method of design synthesis to achieve an exponential current digital-to-analog converter (IDAC) having improved accuracy using a LSB exponential IDAC and an binary-weighted most significant bit (MSB) exponential IDAC.

FIG. 6 illustrates shows a method of design synthesis to achieve an exponential current digital-to-analog converter (IDAC) having improved accuracy using a LSB exponential IDAC and an binary-weighted most significant bit (MSB) exponential IDAC whose method of design synthesis comprising (1) defining a differential non-linearity (DNL) 500, (2) defining number of LSB bits needed for the targeted DNL with a binary weighted MSB 510, (3) calculating the number of bits to be used for the binary-weighted MSB to get the desired IDAC base 520, (4) deriving the minimum current for the Imax 530, (5) defining the LSB as an exponential current mirror according to the specified relationship for the ILSB 540, (6) defining a binary weighted MSB according to the specified relationship for IMSB 550, (7) synthesizing the LSB exponential IDAC 560, (8) synthesizing the binary-weighted most significant bit (MSB) exponential IDAC 570, (9) integrating the LSB exponential IDAC and the binary-weighted most significant bit (MSB) exponential IDAC 580, and (10) optimize said exponential current digital-to-analog converter (IDAC) 590.

As such, a current digital-to-analog converter circuit, and, more particularly, to methods for an exponential current digital-to-analog converter (IDAC) having improved accuracy using a binary-weighted most significant bit (MSB) are herein described. The improvement is achieved with minimal impact on silicon area, and improved matching.

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. A method to achieve an exponential current digital-to-analog converter (IDAC) having improved accuracy using a binary-weighted most significant bit (MSB) comprising:

defining a differential non-linearity (DNL);

defining number of LSB bits needed for the targeted DNL with a binary weighted MSB;

calculating the number of bits to be used for the binary-weighted MSB to get the desired IDAC base;

deriving the minimum current for the Imax;
defining the LSB as an exponential current mirror according to the specified relationship for the ILSB;
defining a binary weighted MSB according to the specified relationship for IMSB; and
defining a differential non-linearity (DNL) according to the definition $$DNL = 1 + \frac{DNL\ \%}{100}.$$

2. The method of claim 1, wherein said definition of LSB bits needed for the targeted DNL with binary-weighted MSB is according to the definition $$DNL_{MSB} = (DNL)^{2^{nLSB}}.$$

3. The method of claim 1, wherein said calculation of the number of bits to be used for the binary-weighted MSB to get the desired IDAC base, is according to the definition $$\text{base} = \frac{(2)^{2^{nMSB}}}{DNL}.$$

4. The method of claim 1, wherein said derivation of the minimum current for the Imax is according to the definition, Io=I max/base.

5. The method of claim 1, wherein said definition of the LSB as an exponential current mirror according to the specified relationship for the ILSB, $$ILSB = \frac{I_0}{G} * (DNL)^{LSB_{code}}$$

For *LSB* code = 0, ... *nLSB*.

6. The method of claim 1, wherein said value of a nMSB for a binary weighted MSB of at least 2 bits.

7. The method of claim 1, wherein said value of an nMSB for a binary weighted MSB of 3 bits.

8. A method of design synthesis to achieve an exponential current digital-to-analog converter (IDAC) having improved accuracy using a LSB exponential IDAC and an binary-weighted most significant bit (MSB) exponential IDAC whose method of design synthesis comprising:
defining a differential non-linearity (DNL);
defining number of LSB bits needed for the targeted DNL with a binary weighted MSB;
calculating the number of bits to be used for the binary-weighted MSB to get the desired IDAC base;
deriving the minimum current for the Imax;
defining the LSB as an exponential current mirror according to the specified relationship for the ILSB;
defining a binary weighted MSB according to the specified relationship for IMSB;
synthesizing said LSB exponential IDAC;
synthesizing said binary-weighted most significant bit (MSB) exponential IDAC;
integrating said LSB exponential IDAC and said binary-weighted most significant bit (MSB) exponential IDAC;
optimize said exponential current digital-to-analog converter (IDAC); and
synthesizing said exponential current digital-to-analog converter (IDAC).

9. The method of design synthesis of claim 8, to achieve an exponential current digital-to-analog converter (IDAC) having improved accuracy using a LSB exponential IDAC and an binary-weighted most significant bit (MSB) exponential IDAC whose method of design synthesis providing a means for removal of MSB bits for reduced complexity.

10. The method of design synthesis of claim 8, to achieve an exponential current digital-to-analog converter (IDAC) having improved accuracy using a LSB exponential IDAC and an binary-weighted most significant bit (MSB) exponential IDAC whose method of design synthesis providing a means for reduction of MSB bits for improved matching.

11. The method of design synthesis of claim 8, to achieve an exponential current digital-to-analog converter (IDAC) having improved accuracy using a LSB exponential IDAC and an binary-weighted most significant bit (MSB) exponential IDAC whose method of design synthesis providing a means for reduction of MSB bits for reduced area and size.

12. The method of design synthesis of claim 8, to achieve an exponential current digital-to-analog converter (IDAC) having improved accuracy using said LSB exponential IDAC and said binary-weighted most significant bit (MSB) exponential IDAC whose method is defined by forming two exponential current mirror networks, where at least one of the current source networks is for the least significant bit (LSB), and at least one of the second current source networks is for the most significant bit (MSB).

* * * * *